(12) United States Patent
Skorka et al.

(10) Patent No.: US 9,683,890 B2
(45) Date of Patent: Jun. 20, 2017

(54) IMAGE SENSOR PIXELS WITH CONDUCTIVE BIAS GRIDS

(71) Applicant: SEMICONDUCTOR COMPONENTS INDUSTRIES, LLC, Phoenix, AZ (US)

(72) Inventors: Orit Skorka, San Jose, CA (US); Salman Kabir, Santa Clara, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 195 days.

(21) Appl. No.: 14/755,745

(22) Filed: Jun. 30, 2015

(65) Prior Publication Data

US 2017/0003165 A1    Jan. 5, 2017

(51) Int. Cl.
H01L 27/00 (2006.01)
G01J 1/44 (2006.01)
G01J 1/02 (2006.01)
G01J 1/04 (2006.01)
H01L 27/146 (2006.01)

(52) U.S. Cl.
CPC ............... *G01J 1/44* (2013.01); *G01J 1/0209* (2013.01); *G01J 1/0411* (2013.01); *G01J 1/0488* (2013.01); *H01L 27/1461* (2013.01); *H01L 27/1464* (2013.01); *H01L 27/14621* (2013.01); *H01L 27/14627* (2013.01); *H01L 27/14636* (2013.01); *H01L 27/14685* (2013.01); *G01J 2001/446* (2013.01); *G01J 2001/448* (2013.01)

(58) Field of Classification Search
CPC ................................................... H01L 27/1464
See application file for complete search history.

(56) References Cited

U.S. PATENT DOCUMENTS

| | | |
|---|---|---|
| 4,315,978 A | 2/1982 | Hartman |
| 5,008,758 A | 4/1991 | Burke |
| 5,889,277 A | 3/1999 | Hawkins et al. |
| 7,662,657 B2 | 2/2010 | Mouli |
| 7,772,028 B2 | 8/2010 | Adkisson |
| 7,781,781 B2 | 8/2010 | Adkisson |
| 8,390,089 B2 | 3/2013 | Chen et al. |
| 8,471,312 B2 | 6/2013 | Kudoh |
| 8,698,217 B2 | 4/2014 | Hsu |
| 8,872,953 B2 | 10/2014 | Sakano et al. |
| 8,878,969 B2 | 11/2014 | Holscher |

(Continued)

*Primary Examiner* — Thanh Luu
(74) *Attorney, Agent, or Firm* — Treyz Law Group, P.C.; Joseph F. Guihan

(57) ABSTRACT

An image sensor with an array of pixels is provided. In order to achieve high image quality, it may be desirable to improve well capacity of individual pixels within the array by forming deep photodiodes in a thick substrate. When forming the array of pixels, conductive contacts may be formed in a back surface of the substrate opposing ground contacts located on a front side of the substrate. A conductive grid layer may be formed over the conductive contacts. A color filter layer may be formed over the conductive grid layer that may include a barrier grid in which color filter material is deposited. The conductive grid layer and conductive contacts may be biased to a voltage to improve the strength of electric fields in the substrate. Conductive contacts will thereby improve charge collection and electrical isolation and prevent electrical crosstalk and blooming.

18 Claims, 9 Drawing Sheets

(56) References Cited

U.S. PATENT DOCUMENTS

| | | | |
|---|---|---|---|
| 8,946,611 B2 | 2/2015 | Iwata | |
| 9,160,949 B2 | 10/2015 | Zhang et al. | |
| 2005/0184353 A1 | 8/2005 | Mouli | |
| 2006/0180885 A1 | 8/2006 | Rhodes | |
| 2009/0140304 A1 | 6/2009 | Kudoh | |
| 2011/0147884 A1 | 6/2011 | Van Noort et al. | |
| 2012/0025060 A1 | 2/2012 | Iwata | |
| 2012/0273906 A1 | 11/2012 | Mackey | |
| 2013/0049082 A1 | 2/2013 | Kato et al. | |
| 2013/0308008 A1 | 11/2013 | Funatsu et al. | |
| 2014/0246707 A1 | 9/2014 | Koo et al. | |
| 2014/0291481 A1 | 10/2014 | Zhang et al. | |
| 2016/0064438 A1* | 3/2016 | Huang | H01L 27/1462 257/432 |
| 2016/0104730 A1 | 4/2016 | Ahmed et al. | |
| 2016/0141317 A1 | 5/2016 | Tekleab | |
| 2016/0190200 A1 | 6/2016 | Shinohara | |
| 2016/0329365 A1 | 11/2016 | Tekleab et al. | |

\* cited by examiner

IMAGE SENSOR PIXELS WITH CONDUCTIVE BIAS GRIDS

BACKGROUND

This relates generally to image sensors, and more specifically to back-side-illuminated (BSI) image sensors with conductive bias grids to enhance charge collection and improve photodiode isolation.

Image sensors are commonly used in electronic devices such as cellular telephones, cameras, and computers to capture images. Conventional image sensors are fabricated on a semiconductor substrate using complementary metal-oxide-semiconductor (CMOS) technology or charge-coupled device (CCD) technology. The image sensors may include an array of image sensor pixels each of which includes a photodiode and other operational circuitry such as transistors formed in the substrate.

Image sensors often include a photodiode having a pinning-voltage which is a design parameter set by the doping levels of the photodiode. During normal operation, a photodiode node is first reset to the pinning-voltage using transistor circuitry. Photons are then allowed to enter the photodiode region for a given amount of time. The photons are converted to charge carriers inside the photodiode, and these charge carriers reduce the reset pinning-voltage. In this process, the maximum total charge stored, $Q_{MAX}$, is commonly referred to as the saturation full well (SFW) and depends on the well capacity of the photodiode. The actual charge stored, Q, is less than or equal to $Q_{MAX}$ based on the intensity and integration time of photons. When it is time to read out the stored signal, the stored charge Q at the photodiode node is transferred to a floating diffusion node through additional transistor circuitry. If care is not taken to maximize the amount of charge Q than can be transferred from the photodiode to the floating diffusion node, charge spill back can degrade image quality. Maximum charge stored, $Q_{MAX}$, determines the highest signal level detected in the photodiode array. High $Q_{MAX}$ improves dynamic range of an image sensor, lowers the noise floor, and can be used to improve saturation artifacts.

A deep photodiode (DPD) process can be used to increase the quantum efficiency and $Q_{MAX}$ characteristics of a pixel, which have an increasing impact on pixel performance as pixel area decreases. In conventional image sensors, the electric field strength of ground electrodes in a pixel is weakened as the substrate depth of the pixel increases. The DPD process requires a thicker substrate than traditional pixel depth processes and also requires the addition of an additional resistive path, which further decreases the electric field magnitude of the ground contacts as substrate depth increases. As a consequence of the decreased electric field strength, the p-n junction close to the back-side interface of the pixel is not in strong reverse bias, which leads to low charge collection efficiency and weak electrical isolation. The lowered charge collection efficiency occurs due to an increased probability for charge carriers to recombine before reaching the ground contacts. Electrical crosstalk and blooming may occur as a result of weak electrical isolation.

It would therefore be desirable to be able to provide BSI image sensors with enhanced charge collection and improved photodiode isolation.

DETAILED DESCRIPTION

Embodiments of the present invention relate to image sensors, and more specifically to back-side-illuminated (BSI) image sensors with conductive bias grids to enhance charge collection and improve photodiode isolation. It will be recognized by one skilled in the art, that the present exemplary embodiments may be practiced without some or all of these specific details. In other instances, well-known operations have not been described in detail in order not to unnecessarily obscure the present embodiments.

Figure 1:
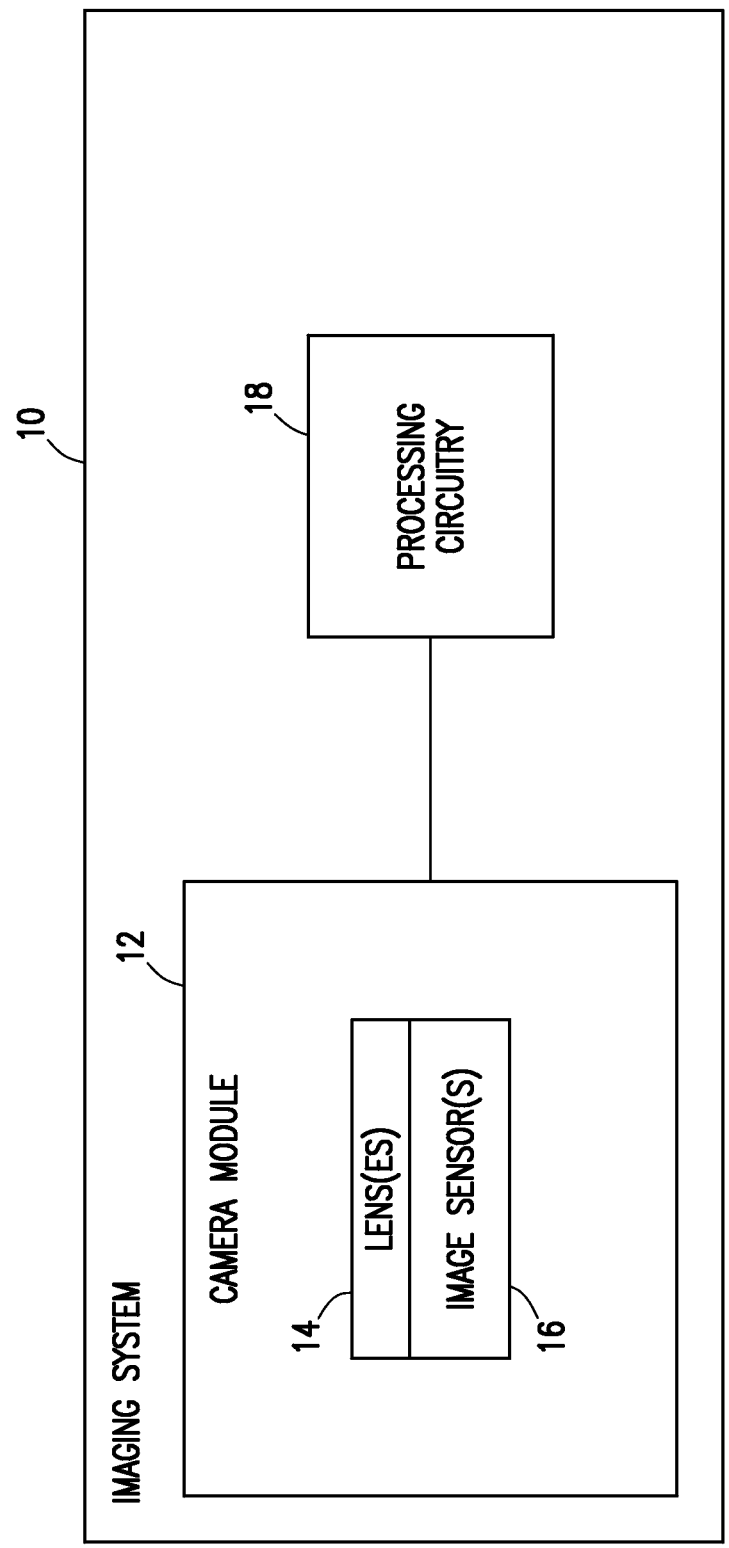
FIG. 1 is a diagram of an illustrative electronic device in accordance with an embodiment.

FIG. 1 is a diagram of an illustrative electronic device that uses an image sensor to capture images. Imaging system 10 of FIG. 1 may be a portable imaging system such as a camera, a cellular telephone, a video camera, or other imaging device that captures digital image data. Camera module 12 may be used to convert incoming light into digital image data. Camera module 12 may include a lens 14 and a corresponding image sensor 16. Lens 14 and image sensor 16 may be mounted in a common package and may provide image data to processing circuitry 18. In some embodiments lens 14 may be part of an array of lenses and image sensor 16 may be part of an image sensor array.

Processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensor 16 or an integrated circuit within module 12 that is associated with image sensor 16). Image data that has been captured and processed by camera module 12 may, if desired, be further processed and stored using processing circuitry 18. Processed image data may, if desired, be provided to external equipment (e.g., a computer or other device) using wired and/or wireless communications paths coupled to processing circuitry 18.

Image sensor 16 may be configured to receive light of a given color by providing the image sensor with a color filter. The color filters that are used for image sensor pixel arrays in the image sensor may, for example, be red filters, blue filters, and green filters. Each filter may form a color filter layer that covers the image sensor pixel array of the image sensor. Other filters such as white color filters, dual-band IR cutoff filters (e.g., filters that allow visible light and a range of infrared light emitted by LED lights), etc. may also be used.

Figure 2:
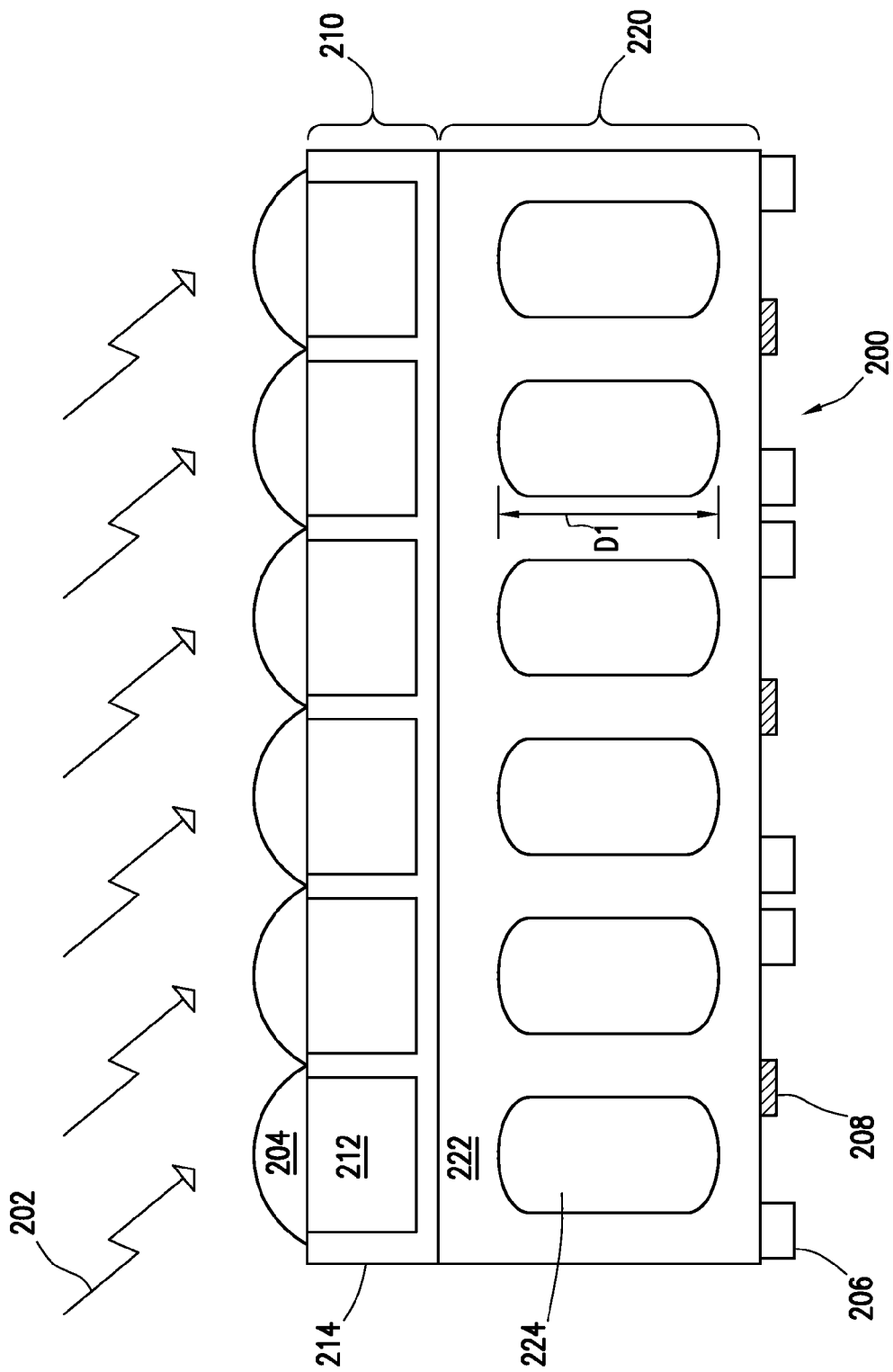
FIG. 2 is a cross-sectional side view of a conventional back-side-illuminated (BSI) image pixel array.

FIG. 2 is a cross-sectional side view of a conventional back-side-illuminated (BSI) image pixel array. As shown in FIG. 2, image pixel array 200 includes a color filter array 210 formed on a back surface of a substrate 220. An array of microlenses 204 is formed over the color filter array 210. Color filter array 210 includes color filter material 212 deposited in cavities of dielectric color filter barrier grid 214. Substrate 220 includes active photodiode regions 224 having a height D1 and being formed in lightly doped semiconductor region 222. Transfer gates 206 and ground contacts 208 are formed on the front surface of substrate 220.

During operation, photons 202 are permitted to enter through microlens array 204 and color filter array 210 for a pre-defined amount of time. It is desirable for a majority of the photons 202 that enter image pixel array 200 to generate electron-hole pairs inside active photodiode regions 224. Active photodiode regions 224 may store an electron charge Q during this time period. The magnitude of charge that is stored in active photodiode regions 224 is limited by the saturated-full-well capacity of active photodiode regions 224. The charge Q may then be transferred from active photodiode regions 224 to floating diffusion nodes with transfer gates 206.

The embodiment shown in FIG. 2 has reduced utility when pixel area is small. Because of the shallow depth D1 of substrate 220, quantum efficiency and full well capacity of image pixel array 200 are limited. If substrate depth were to be increased, the magnitude of electric fields in substrate 220 associated with ground contacts 208 would be weakened in correlation with the increase in depth. As a consequence of the weakened electric fields, portions of photodiode regions 224 closest to the back surface of substrate 220 would not be in strong reverse bias, which would lead to low charge collection efficiency, electrical crosstalk, and blooming. It would therefore be desirable to increase substrate depth D1 in image pixel array 200 without sacrificing electric field strength in substrate 220.

Figure 3:
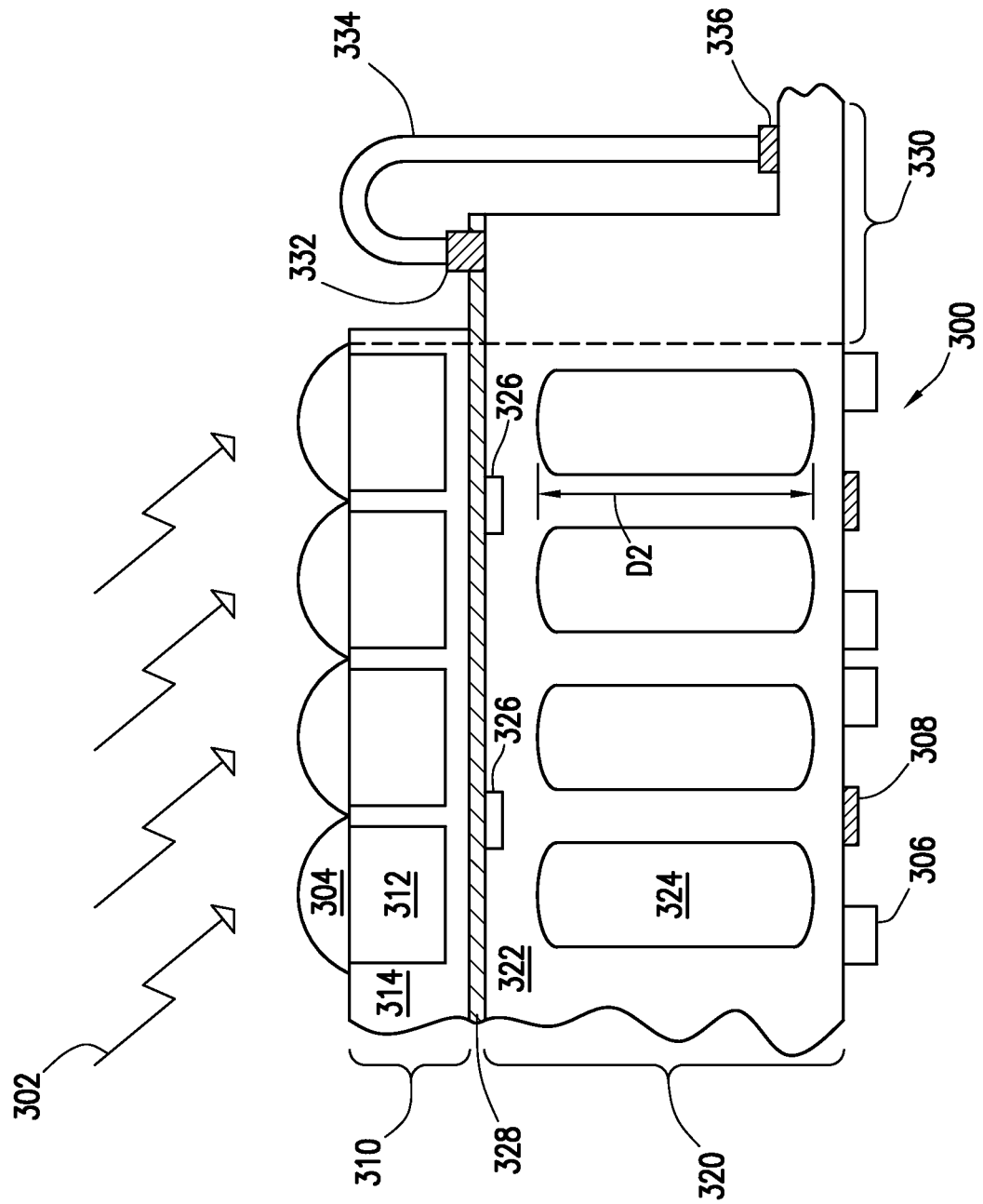
FIG. 3 is cross-sectional side view of an illustrative BSI image pixel array showing conductive substrate contacts, a bias grid layer, dielectric color filter barriers, and a wire-bond edge interface in accordance with an embodiment.

FIG. 3 is a cross-sectional side view of an illustrative BSI image pixel array showing conductive substrate contacts, a bias grid layer, dielectric color filter barriers, and a wire-bond edge interface in accordance with an embodiment. As shown in FIG. 3, image pixel array 300 may receive photons 302 and may include an image pixel array edge 330 and a color filter 310 formed over a conductive bias grid layer 328 that may be formed on a back surface of a substrate 320. Substrate 320 may consist of semiconductor material (e.g., silicon, silicon carbide, gallium nitride, gallium arsenide, etc.). Conductive bias grid layer 328 may be formed from metal material (e.g., aluminum, tungsten, copper, etc.), conductive oxides (e.g., indium tin oxide, bismuth titanate), or doped semiconductor material. An array of microlenses 304 may be formed over color filter array 310. Ground contacts 308 and transfer gates 306 may be formed on a front surface of semiconductor 320. Ground contacts 308 may be formed from conductive material (e.g., aluminum, tungsten, copper) and/or may be formed over a doped portion of substrate 320.

Color filter array 310 may include color filter material 312 that is deposited in cavities of color filter barrier grid 314. In the illustrative example of FIG. 3, color filter barrier grid 314 is formed from dielectric material. Each cell in color filter barrier grid 314 may define one or more individual pixels in image pixel array 300. Color filter barrier grid 314 may be formed directly over conductive bias grid layer 328 and may be formed in the same grid pattern as conductive bias grid layer 328. Color filter material 312 may be deposited in any suitable pattern (e.g., a Bayer color filter pattern, a cyan-yellow-green-magenta filter pattern, a red-green-blue-emerald filter pattern, or other suitable pattern). In some embodiments, color filter material 312 may be replaced with transparent filters for monochromatic image sensing. It should be noted that the dielectric color filter barriers may include electrically isolated metal portions that may reduce optical crosstalk caused by light rays that reach the image plane at high incident angles.

Substrate 320 may include conductive substrate contacts 326 that may contact conductive bias grid layer 328 and that may be formed in the back surface of lightly doped semiconductor region 322 using ion implantation or diffusion. Conductive substrate contacts 326 may be formed directly across from ground contacts 308. Conductive substrate contacts 326 may be formed at each intersection point of conductive bias grid layer 328, or may be formed at alternating intersection points of conductive bias grid layer 328. Substrate 320 may further include active photodiode regions 324 having a height D2 and being formed in lightly doped semiconductor region 322. Image pixel array 300 may be formed using a deep photodiode (DPD) process, and therefore height D2 of active photodiode regions 324 may be greater than height D1 of active photodiode regions 224 shown in FIG. 2. The thickness of substrate 320 is therefore greater than the thickness of substrate 220 shown in FIG. 2. This increase in thickness decreases the electric field magnitude between substrate contacts 326 and ground contacts 308.

Image pixel edge 330 may include a bond pad 332 that is connected to conductive bias grid layer 328, a bond pad 336 that is coupled to external voltage supply circuitry, and a wire bond 334 that is coupled between bond pad 332 and bond pad 336. External voltage supply circuitry may apply a bias voltage to conductive bias grid layer 328 through wire bond 334 and bond pads 332 and 336. By applying a bias voltage to conductive bias grid layer 328, the electric field strength between conductive substrate contacts 326 and ground contacts 308 may be increased. By increasing the electric field strength in this way, the reverse-bias strength of the p-n junction closest to the back-side of the semiconductor substrate may be increased. The negative effects caused by increasing substrate thickness may thereby be nullified and electrical isolation and charge collection efficiency may be preserved or improved.

Figure 4:
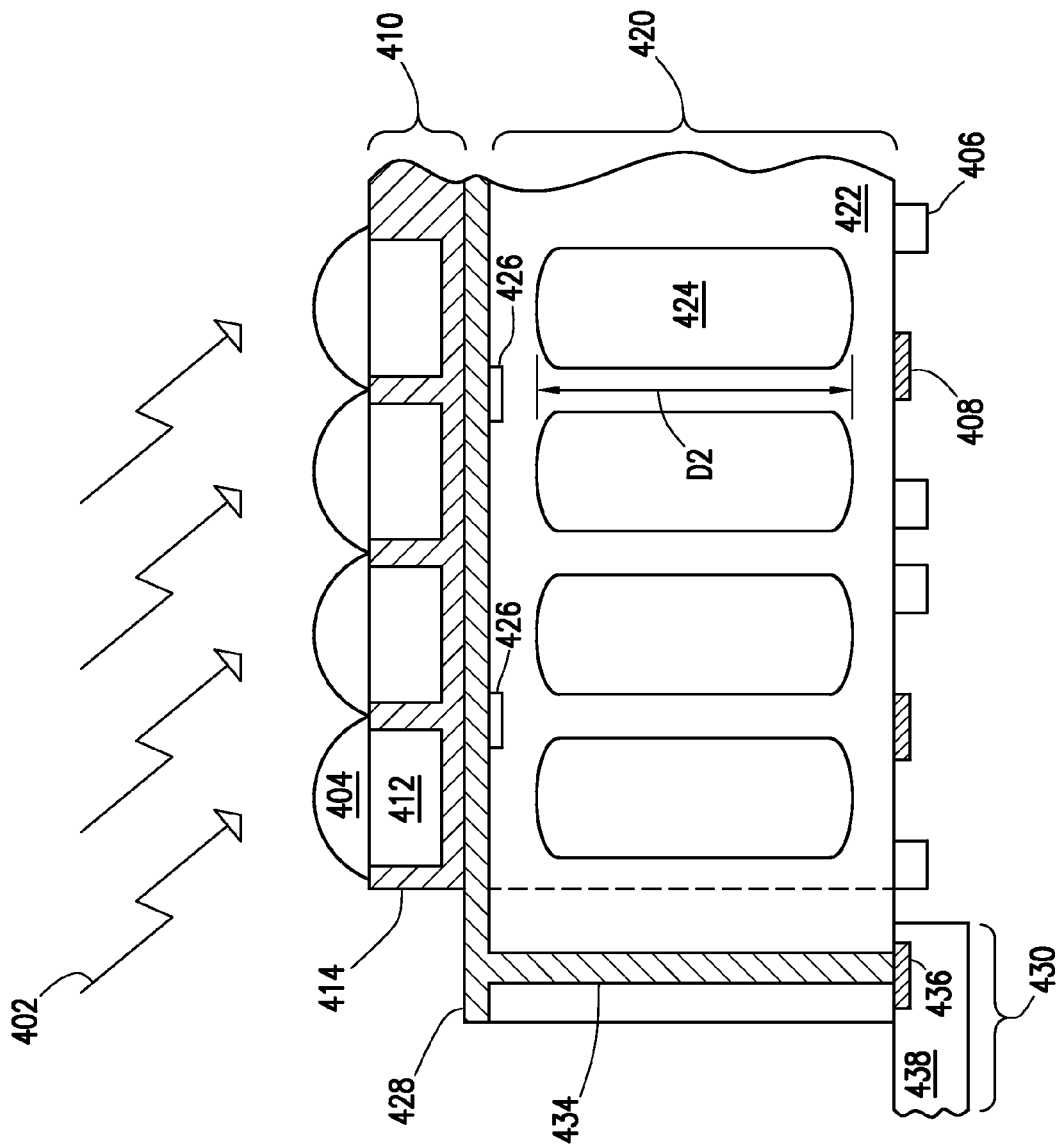
FIG. 4 is a cross-sectional side view of an illustrative BSI image pixel array showing conductive substrate contacts, a bias grid layer, metal color filter barriers, and a through-hole via edge interface in accordance with an embodiment.

FIG. 4 is a cross-sectional side view of an illustrative BSI image pixel array showing conductive substrate contacts, a bias grid layer, metal color filter barriers, and a through-hole via edge interface in accordance with an embodiment. As shown in FIG. 4, image pixel array 400 may receive photons 402 and may include an image pixel array edge 430 and a color filter 410 formed over a conductive bias grid layer 428 that may be formed on a back surface of substrate 420. Conductive bias grid layer 428 may be formed from conductive material (e.g., aluminum, tungsten, copper, other suitable metals, etc.), conductive oxides (e.g., indium tin oxide, bismuth titanate, etc.), or doped semiconductor material. An array of microlenses 404 may be formed over color filter array 410. Ground contacts 408 and transfer gates 406 may be formed on a front surface of semiconductor 420. Ground contacts 408 may be formed from conductive material (e.g., aluminum, tungsten, copper, or other suitable metals) and may be formed over a doped portion of substrate 420.

Color filter array 410 may include color filter material 412 that is deposited in cavities of color filter barrier grid 414. In the illustrative example of FIG. 4, color filter barrier grid 414 is formed from a conductive material such as metal (e.g., aluminum, tungsten, copper, etc.). Each cell in color filter barrier grid 414 may define one or more individual pixels in image pixel array 400. Color filter barrier grid 414 may be formed directly over conductive bias grid layer 428 and may be formed in the same grid pattern as conductive bias grid layer 428. Color filter barrier grid 414 and conductive bias grid layer 428 may be formed from the same material in the same process step. Color filter material 412 may be deposited in any suitable pattern.

Substrate 420 may include conductive substrate contacts 426 that may contact conductive bias grid layer 428 and that may be formed in the back surface of lightly doped semiconductor region 422 using ion implantation or diffusion. Conductive substrate contacts 426 may be formed directly across from ground contacts 408. Conductive substrate contacts 426 may be formed at each intersection point of conductive bias grid layer 428, or may be formed at alternating intersection points of conductive bias grid layer 428. Substrate 420 may further include active photodiode regions 424 having a height D2 and being formed in lightly doped semiconductor region 422. Image pixel array 400 may be formed using a DPD process, and therefore height D2 of active photodiode regions 424 may be greater than height D1 of active photodiode regions 224 shown in FIG. 2. The thickness of substrate 420 is therefore greater than the thickness of substrate 220 shown in FIG. 2. This increase in thickness decreases the electric field magnitude between substrate contacts 426 and ground contacts 408.

Image pixel edge 430 may include a through-hole via 434 that is coupled between conductive bias grid layer 428 and metal contact 436. Metal contact 436 may be formed in an additional substrate 438 that may be attached to substrate 420. Metal contact 436 may be coupled to external voltage supply circuitry. External voltage supply circuitry may apply a bias voltage to conductive bias grid layer 428 through via 434 and metal contact 436. By applying a bias voltage to conductive bias grid layer 428, the electric field strength between conductive substrate contacts 426 and ground contacts 408 may be increased. By increasing the electric field strength in this way, the reverse-bias strength of the p-n junction closest to the back-side of the semiconductor substrate may be increased. The negative effects caused by increasing substrate thickness may thereby be nullified and electrical isolation and charge collection efficiency may be preserved or improved.

Figure 5:
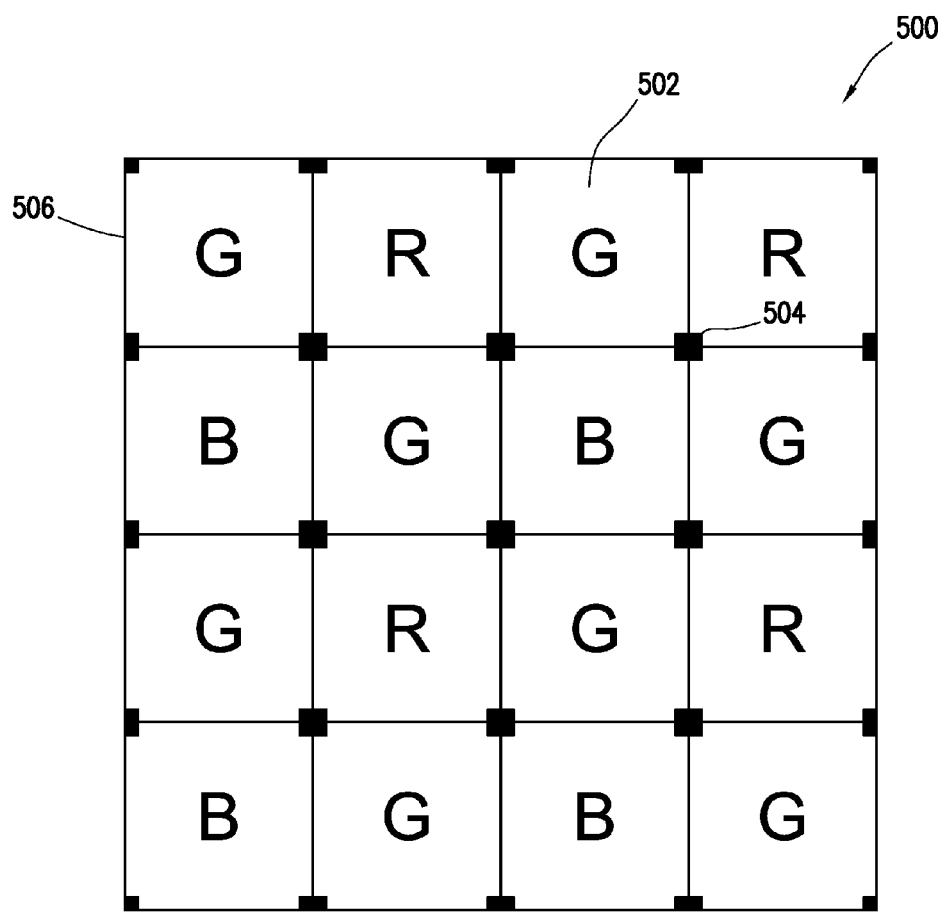
FIG. 5 is a top-down view of an illustrative image pixel array showing contacts located at each intersection of a bias grid under a Bayer color filter array in accordance with an embodiment.

FIG. 5 is a top-down view of an illustrative BSI image pixel array showing contacts located at each intersection of a bias grid under a Bayer color filter array in accordance with an embodiment. As shown in FIG. 5, image pixel array 500 may include pixels 502 that are arranged in rows and columns and conductive substrate contacts 504 located at each intersection of bias grid 506 and formed in the back surface of a semiconductor substrate. Bias grid 506 is formed over and electrically connected to substrate contacts 504. Each conductive substrate contact 504 corresponds to a respective ground contact (e.g. ground contacts 308 in FIG. 3) located on the opposite side of the semiconductor substrate. When a voltage is applied to bias grid 506, the electric field between conductive substrate contacts 504 and their respective ground contacts (e.g. ground contacts 308 in FIG. 3) increases in strength and improves the reverse-bias of back-side p-n junctions in pixels 502. In this arrangement, each pixel may have an associated substrate contact, allowing for individual control of the reverse-bias of the backside p-n junctions in the pixel.

The example of FIG. 5 in which each pixel is provided with an associated substrate contact 504 is merely illustrative. If desired, a substrate contact may be shared among multiple pixels, as shown in FIG. 6.

Figure 6:
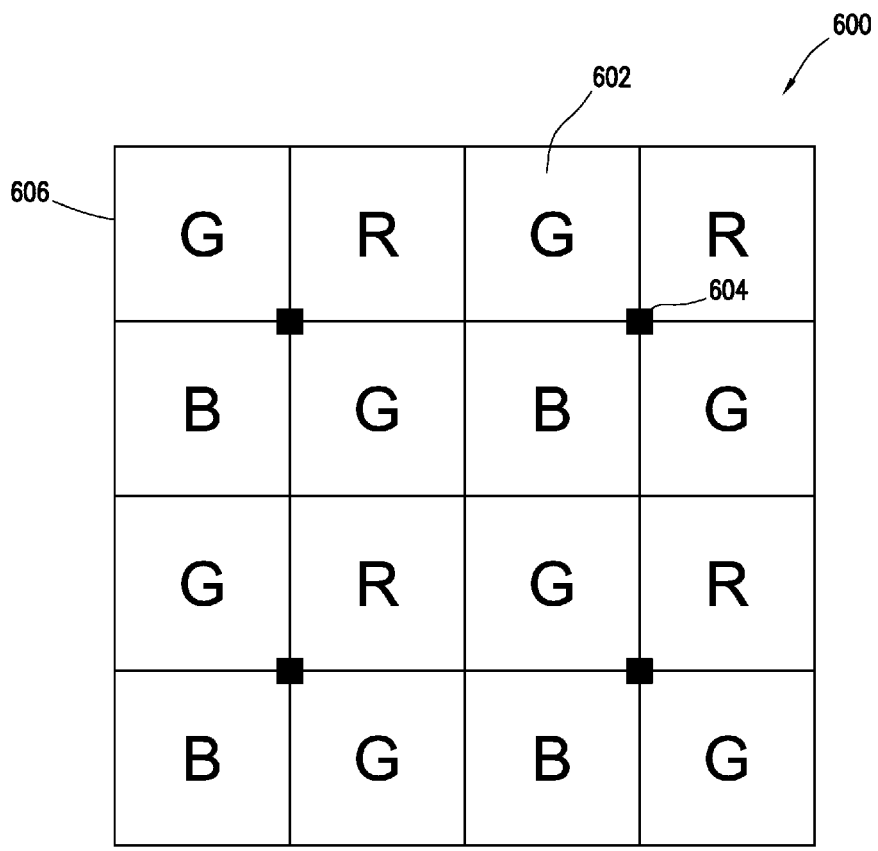
FIG. 6 is a top-down view of an illustrative image pixel array showing shared contacts located at alternating intersections of a bias grid under a Bayer color filter array in accordance with an embodiment.

FIG. 6 is a top-down view of an illustrative BSI image pixel array showing shared contacts located at alternating intersections of a bias grid under a Bayer color filter array in accordance with an embodiment. As shown in FIG. 6, image pixel array 600 may include pixels 602 that are arranged in rows and columns and conductive substrate contacts 604 located at alternating intersections of bias grid 606 and formed in the back surface of a semiconductor substrate. Bias grid 606 is formed over and electrically connected to substrate contacts 604. Each conductive substrate contact 604 corresponds to a respective ground contact (e.g. ground contacts 308 in FIG. 3) located on the opposite side of the semiconductor substrate. When a voltage is applied to bias grid 606, the electric field between conductive substrate contacts 604 and their respective ground contacts (e.g. ground contacts 308 in FIG. 3) increases in strength and improves the reverse-bias of back-side p-n junctions in pixels 602. In this arrangement, multiple pixels share a single substrate contact, which requires the formation of fewer total substrate contacts.

Figure 7:
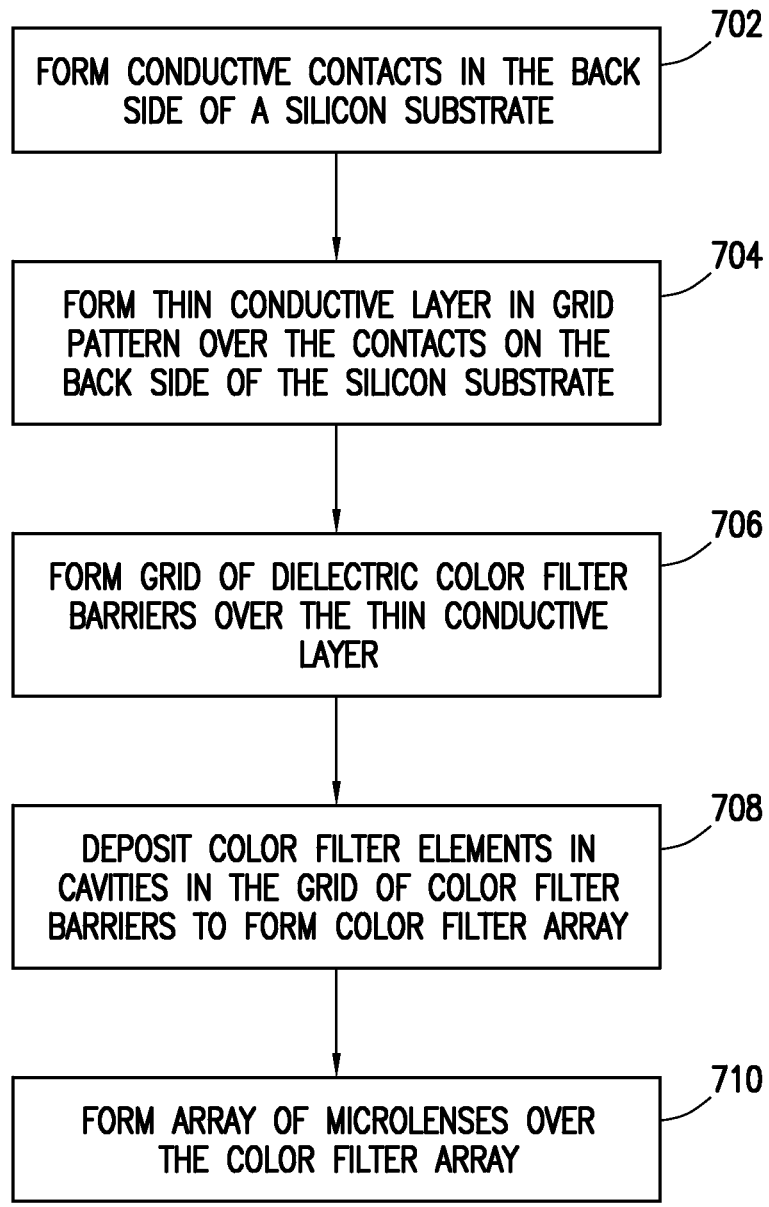
FIG. 7 is a flow chart of illustrative steps involved in fabricating a BSI image pixel array having conductive substrate contacts, a bias grid layer, and a grid of dielectric color filter barriers in accordance with an embodiment.

FIG. 7 is a flow chart of illustrative steps involved in fabricating a BSI image pixel array having substrate contacts, a bias grid layer, and a grid of dielectric color filter barriers in accordance with an embodiment.

At step 702, conductive contacts (e.g., conductive substrate contacts 326 in FIG. 3) are formed in the back side of a silicon substrate (e.g., silicon substrate 320 in FIG. 3). It should be noted that this example is merely illustrative. Other embodiments may include substrates made of semiconductor materials other than silicon (e.g., silicon carbide, gallium nitride, gallium arsenide, etc.).

At step 704, a thin conductive layer (e.g., conductive bias grid layer 328 in FIG. 3) is formed in a grid pattern over the contacts on the back side of the silicon substrate.

At step 706, a grid of dielectric color filter barriers (e.g., dielectric color filter barriers 314 in FIG. 3) are formed over the thin conductive layer.

At step 708, color filter elements (e.g., color filter material 312 in FIG. 3) are deposited in cavities in the grid of color filter barriers to form a color filter array (e.g., color filter array 310 in FIG. 3).

At step 710, an array of microlenses (e.g., array of microlenses 304 in FIG. 3) are formed over the color filter array.

Figure 8:
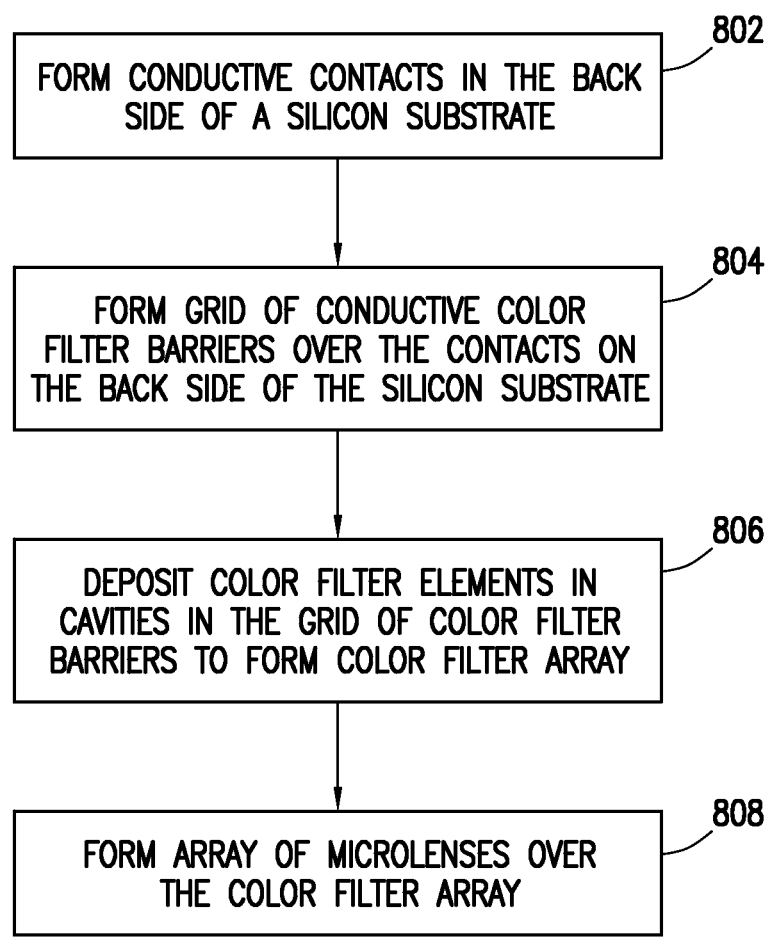
FIG. 8 is a flow chart of illustrative steps involved in fabricating a BSI image pixel array having conductive substrate contacts and a bias grid of metal color filter barriers in accordance with an embodiment.

FIG. 8 is a flow chart of illustrative steps involved in fabricating a BSI image pixel array having substrate contacts and a bias grid of metal color filter barriers in accordance with an embodiment.

At step 802, conductive contacts (e.g., conductive substrate contacts 426 in FIG. 4) are formed in the back side of a silicon substrate (e.g., silicon substrate 420 in FIG. 4). It should be noted that this example is merely illustrative. Other embodiments may include substrates made of semiconductor materials other than silicon (e.g., silicon carbide, gallium nitride, gallium arsenide, etc.).

At step 804, a grid of metal color filter barriers (e.g., dielectric color filter barriers 414 in FIG. 4) are formed over the contacts on the back side of the silicon substrate.

At step 806, color filter elements (e.g., color filter material 412 in FIG. 4) are deposited in cavities in the grid of color filter barriers to form a color filter array (e.g., color filter array 410 in FIG. 4).

At step 808, an array of microlenses (e.g., array of microlenses 404 in FIG. 4) are formed over the color filter array.

Figure 9:
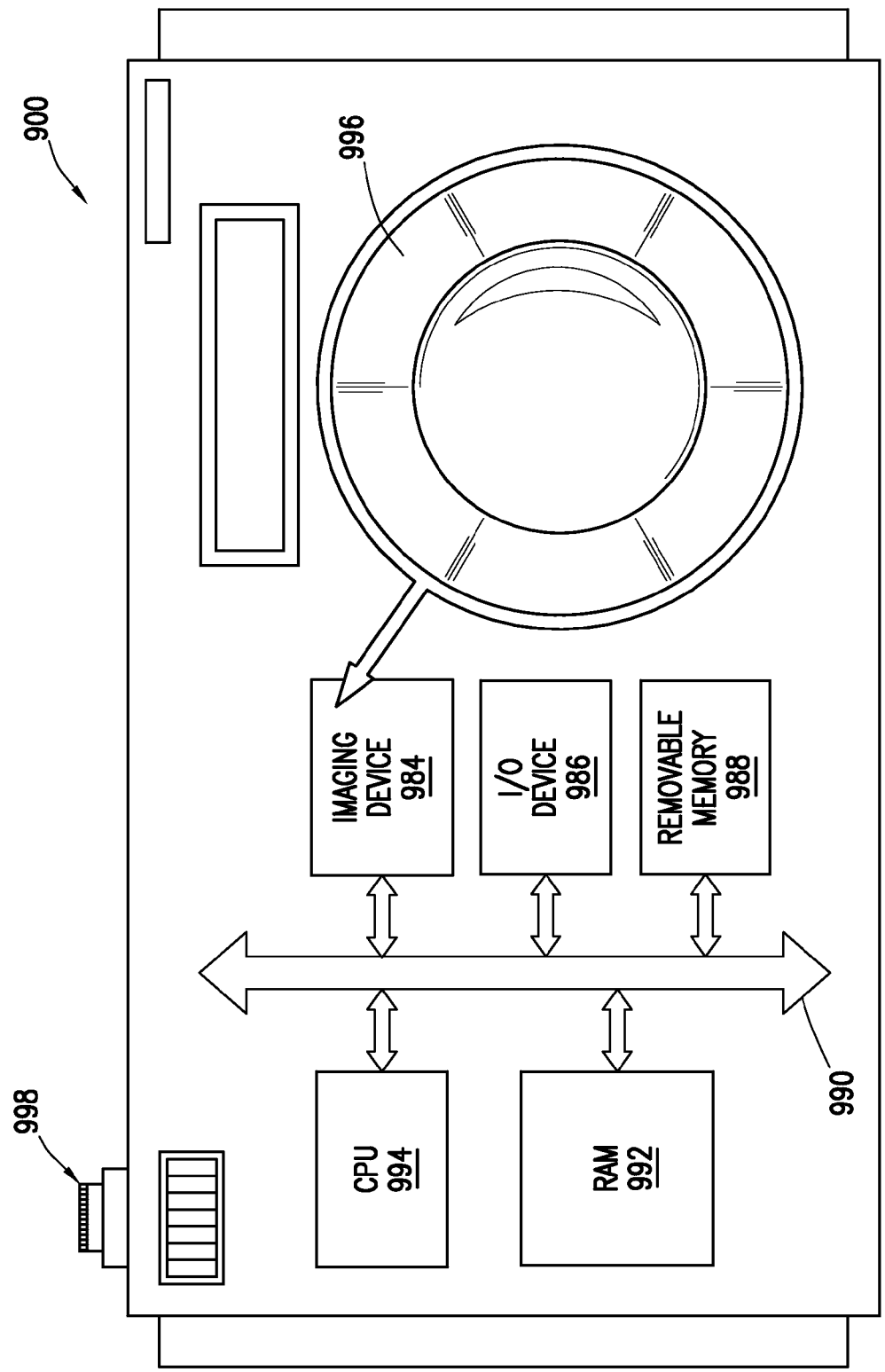
FIG. 9 is a block diagram of a processor system employing at least some of the embodiments of the image pixel array in FIGS. 3-6 in accordance with an embodiment.

FIG. 9 is a block diagram of a processor system employing at least some of the embodiments of the image pixel array in FIGS. 3-6. Device 984 may comprise the elements of device 10 (FIG. 1) or any relevant subset of the elements. Processor system 900 is exemplary of a system having digital circuits that could include imaging device 984. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

Processor system 900, which may be a digital still or video camera system, may include a lens or multiple lenses indicated by lens 996 for focusing an image onto an image sensor, image sensor array, or multiple image sensor arrays such as image sensor 16 (FIG. 1) when shutter release button 998 is pressed. Processor system 900 may include a central processing unit such as central processing unit (CPU) 994. CPU 994 may be a microprocessor that controls camera functions and one or more image flow functions and communicates with one or more input/output (I/O) devices 986 over a bus such as bus 990. Imaging device 984 may also communicate with CPU 994 over bus 990. System 900 may include random access memory (RAM) 992 and removable memory 988. Removable memory 988 may include flash memory that communicates with CPU 994 over bus 990. Imaging device 984 may be combined with CPU 994, with or without memory storage, on a single integrated circuit or on a different chip. Although bus 990 is illustrated as a single bus, it may be one or more buses or bridges or other communication paths used to interconnect the system components.

Various embodiments have been described illustrating image sensor having an array of image sensor pixels that includes conductive contacts and a conductive grid layer that may receive a bias voltage to bolster electric field strength with a substrate in the image sensor, which may help improve electrical isolation and charge collection efficiency.

An electronic device having an array of image sensor pixels may include photosensitive elements formed in a semiconductor substrate having first and second opposing surfaces, conductive contacts formed in the first surface of the semiconductor substrate, a conductive layer formed over the conductive contacts, a color filter array formed on the first surface of the semiconductor substrate, an array of microlenses formed over the color filter array, and ground contacts formed on the second surface of the semiconductor substrate.

In an embodiment, the electronic device may include a bond pad formed at an edge of the array of image sensor pixels and a wire bond that is coupled between the bond pad and external voltage supply circuitry that is configured to apply a voltage to the conductive layer. In another embodiment, the electronic device may include a conductive via that is formed in the semiconductor substrate at an edge of the array of image sensor pixels and that is coupled between the conductive layer and external voltage supply circuitry that is configured to apply a voltage to the conductive layer.

In an embodiment, the color filter array may include a grid of dielectric material having an array of openings and color filter elements that are formed in the openings in the grid of dielectric material.

In an embodiment, the conductive contacts may be formed below intersections of the grid of dielectric material.

In an embodiment, the conductive layer may be formed in a grid pattern that overlaps the grid of dielectric material.

In an embodiment, the conductive layer may be formed from doped dielectric material. In another embodiment, the thin conductive layer may be formed from metal.

An image sensor having an array of pixels may include photodiodes formed in a semiconductor substrate, conductive contacts formed in a first side of the semiconductor substrate, a conductive grid layer formed over and in contact with the contacts on the first side of the semiconductor substrate that may include a grid of color filter barriers having intersections and being formed over the conductive grid layer, a microlens array formed over the color filter array, and metal contacts formed on a second side of the semiconductor substrate.

In an embodiment, the color filter array may include color filter elements that are deposited in cavities in the grid of color filter barriers.

In an embodiment, the grid of color filter barriers conductive. In another embodiment, the grid of color filter barriers may be insulating and may include electrically isolated metal.

In an embodiment, the conductive contacts may be formed under each intersection of the grid of color filter barriers. In another embodiment, the conductive contacts may be formed under less than all of the intersections in the grid of color filter barriers.

In an embodiment, the color filter array may be a Bayer color filter array.

In an embodiment, the conductive contacts may overlap the metal contacts.

A system may include a central processing unit, memory, a lens, input-output circuitry, and an imaging device. The imaging device may include an array of pixels arranged in rows and columns. The array of pixels may include photodiodes formed in a substrate, conductive contacts formed in a first side of the substrate, a color filter array formed on the first side of the substrate, an array of microlenses formed over the color filter array, and ground contacts formed on a second side of the substrate. The color filter array may include a grid of metal barriers formed over the conductive contacts.

In an embodiment, the conductive contacts may be formed directly opposite the ground contacts. In another embodiment, the grid of metal barriers may be coupled to external voltage supply circuitry. The external voltage supply circuitry may be configured to apply a voltage to the grid of metal barriers. In another embodiment, the conductive contacts may be formed from doped semiconductor material.

The foregoing is merely illustrative of the principles of this invention and various modifications can be made by those skilled in the art without departing from the scope and spirit of the invention. The foregoing embodiments may be implemented individually or in any combination.

What is claimed is:

1. An electronic device having an array of image sensor pixels, comprising:
   photosensitive elements formed in a semiconductor substrate having first and second opposing sides;
   conductive contacts formed on the first side of the semiconductor substrate;
   a conductive layer formed over the conductive contacts;
   a color filter array formed over the first side of the semiconductor substrate;
   an array of microlenses formed over the color filter array;
   ground contacts formed on the second side of the semiconductor substrate; and
   external voltage supply circuitry, wherein the external voltage supply circuitry is configured to apply a voltage to the conductive layer.

2. The electronic device defined in claim 1, further comprising:
   a bond pad formed at an edge of the array of image sensor pixels; and
   a wire bond coupled between the bond pad and the external voltage supply circuitry.

3. The electronic device defined in claim 1, further comprising:
   a conductive via that is formed in the semiconductor substrate at an edge of the array of image sensor pixels and that is coupled between the conductive layer and the external voltage supply circuitry.

4. The electronic device defined in claim 1, wherein the color filter array further comprises:
   a grid of dielectric material having an array of openings; and
   color filter elements formed in the openings in the grid of dielectric material.

5. The electronic device defined in claim 4, wherein the conductive contacts are formed below intersections in the grid of dielectric material.

6. The electronic device defined in claim 4, wherein the conductive layer is formed in a grid pattern that overlaps the grid of dielectric material.

7. The electronic device defined in claim 1, wherein the conductive layer comprises doped dielectric material.

8. The electronic device defined in claim 1, wherein the conductive layer comprises metal.

9. An image sensor having an array of pixels, comprising:
   photodiodes formed in a semiconductor substrate;
   conductive contacts formed in a first side of the semiconductor substrate;
   a conductive grid layer formed over and in contact with the conductive contacts on the first side of the semiconductor substrate;
   a color filter array formed on the first side of the semiconductor substrate comprising a grid of color filter barriers formed over the conductive grid layer and color filter elements disposed in cavities in the grid of color filter barriers;
   a microlens array formed over the color filter array; and
   metal contacts formed on a second side of the semiconductor substrate.

10. The image sensor defined in claim 9, wherein the grid of color filter barriers comprises a conductive grid of color filter barriers.

11. The image sensor defined in claim 9, wherein the grid of color filter barriers comprises electrically isolated metal formed in an insulating grid of color filter barriers.

12. The image sensor defined in claim 9, wherein the conductive contacts are formed under respective intersections in the grid of color filter barriers.

13. The image sensor defined in claim 9, wherein the grid of color filter barriers has a plurality of intersections and wherein the conductive contacts are formed under less than all of the intersections in the grid of color filter barriers.

14. The image sensor defined in claim 9, wherein the color filter array comprises a Bayer color filter array.

15. The image sensor defined in claim 9, wherein the conductive contacts overlap the metal contacts.

16. A system, comprising:
   a central processing unit;
   memory;
   a lens;
   input-output circuitry; and
   an imaging device, wherein the imaging device comprises:
      an array of pixels arranged in rows and columns, wherein the array of pixels comprises:
         photodiodes formed in a substrate;
         conductive contacts formed in a first side of the substrate, wherein the conductive contacts comprise doped semiconductor material;
         a color filter array formed on the first side of the substrate, wherein the color filter array comprises a grid of metal barriers formed over the conductive contacts;
         an array of microlenses formed over the color filter array; and
         ground contacts formed on a second side of the substrate.

17. The system defined in claim 16, wherein the conductive contacts are formed directly opposite the ground contacts.

18. The system defined in claim 16, wherein the grid of metal barriers is coupled to external voltage supply circuitry that is configured to apply a voltage to the grid of metal barriers.

* * * * *